US006828813B2

(12) United States Patent
Hunter

(10) Patent No.: US 6,828,813 B2
(45) Date of Patent: Dec. 7, 2004

(54) NONBINDING ALIGNMENT PIN

(75) Inventor: Bryon J. Hunter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/454,970

(22) Filed: Jun. 5, 2003

(65) Prior Publication Data

US 2003/0206032 A1 Nov. 6, 2003

Related U.S. Application Data

(62) Division of application No. 09/626,470, filed on Jul. 26, 2000, now Pat. No. 6,586,957.

(51) Int. Cl.[7] .................................................. G01R 31/02

(52) U.S. Cl. ............................ 324/761; 72/446; 72/462

(58) Field of Search ................................. 324/760, 761, 324/765, 158.1, 755, 754, 751, 757; 72/446, 462, 481, 482

(56) References Cited

U.S. PATENT DOCUMENTS

| | | | |
|---|---|---|---|
| 3,747,283 A | 7/1973 | Price | |
| 3,864,000 A | 2/1975 | Coller et al. | |
| 3,905,669 A | 9/1975 | McCormick | |
| 4,211,917 A | 7/1980 | Hofmann | |
| 4,801,225 A | 1/1989 | Morghen | |
| 5,046,707 A | 9/1991 | Allen | |
| 5,068,601 A | 11/1991 | Parmenter | |
| 5,113,686 A | 5/1992 | Kawahara | |
| 5,263,802 A | 11/1993 | Fichot et al. | |
| 5,321,351 A | 6/1994 | Swart et al. | |
| 5,332,384 A | 7/1994 | Abramat | |
| 5,490,190 A | 2/1996 | Hopkins et al. | |
| 5,490,317 A | 2/1996 | Kubert | |
| 5,654,631 A | 8/1997 | Ames | |
| 5,673,805 A | 10/1997 | Chaffin | |
| 5,729,149 A | 3/1998 | Bradshaw et al. | |
| 5,743,510 A | 4/1998 | Johnston | |
| 5,772,099 A | 6/1998 | Gravener | |
| 5,818,691 A | 10/1998 | McMahan et al. | |
| 5,938,377 A | 8/1999 | Jordberg et al. | |
| 5,973,285 A | 10/1999 | Dietrich et al. | |
| 6,359,452 B1 * | 3/2002 | Mozzetta | 324/754 |

OTHER PUBLICATIONS

Oberg, Erik et al., *Machinery's Handbook, 23rd Edition*, Industrial Press, Inc. New York, 1988, pp. 2201–2204.

Booser, E. Richard Ph.D., *CRC Handbook of Lubrication* (*Theory and Practice of Tribology* ) *Volume II, Theory and Design*, CRC Press, Inc. Boca Raton, Florida, 1983, pp. 31–48.

Bowden, Frank Philip et al., *Friction, An Introduction to Tribology*, Anchor Press/Doubleday, Garden City New York, 1973, pp. 47–75.

* cited by examiner

*Primary Examiner*—David A. Zarneke
*Assistant Examiner*—Trung Q. Nguyen
(74) *Attorney, Agent, or Firm*—TraskBritt

(57) ABSTRACT

An alignment pin is provided for use in aligning two structures that are to be joined or mated. The alignment pin includes a shank portion and at least one register portion configured for insertion into a mating hole and aligning the mating hole thereon. The register portion includes an outer surface comprising a plurality of contact regions separated by intervening relief regions of a lesser lateral extent than the contact regions. The contact regions may be disposed on the ends of a plurality of fins extending from the register portion and separated on either side by the relief regions. Junk slots for removing debris from between the alignment pin and the wall of the mating hole are provided by the relief regions. The present invention enables minimization of the overall physical dimensions of the surface area of the alignment pin which is in contact with the surface of the mating hole.

14 Claims, 8 Drawing Sheets

NONBINDING ALIGNMENT PIN

CROSS-REFERENCE TO RELATED APPLICATION

This application is a divisional of application Ser. No. 09/626,470, filed Jul. 26, 2000, now U.S. Pat. No. 6,586,957, issued Jun. 1, 2003.

BACKGROUND OF THE INVENTION

1. Field of the Invention

The present invention relates generally to an alignment pin for aligning two structures that are to be joined or mated. Specifically, the present invention relates to an alignment pin providing a greatly reduced potential for binding and, more particularly, to a nonbinding alignment pin for use in aligning a test head with a semiconductor device handler while docking the test head to the handler.

2. State of the Art

Electrical, functional, and environmental testing is an important facet of semiconductor device manufacturing. Semiconductor devices, such as bare semiconductor dice and packaged integrated circuit chips, are routinely subjected to a wide array of tests directed to screening out damaged or defective devices and to measuring the operational characteristics of a device for classification and subsequent sorting. In order to facilitate handling of a large number of semiconductor devices during production, the handling and testing of semiconductor devices is usually automated. Automated equipment for handling, testing, and sorting semiconductor devices is well known in the art.

Shown schematically in FIG. 1 is an exemplary typical semiconductor device test system 5. The test system 5 includes a handler 10 and a test head 20, which are shown in an undocked, or separated, condition. The handler 10 is configured to receive semiconductor devices from a source—for example, a tube or a tray—and to unload the semiconductor devices onto a transport medium, such as a boat. The handler 10 then transports the semiconductor devices to a test station 12 for testing. Also, the handler 10 may thermally condition the semiconductor devices prior to testing. At the test station 12, the handler 10 positions the semiconductor devices such that leads extending from each individual semiconductor device are in electrical contact with a plurality of test contacts 30 extending from the test head 20. In order to obtain reliable test data, robust and reliable electrical contact must be maintained between the semiconductor device leads and the test contacts 30 of the test head 20.

A significant factor affecting the electrical connection between the leads of a semiconductor device and the corresponding test contacts 30 on the test head 20 is alignment between the test head 20 and the handler 10 and, hence, the alignment between the test contacts 30 and the semiconductor device leads. Thus, docking of the test head 20 onto the handler 10 is a critical procedure as the test head 20, and the test contacts 30 extending therefrom, must be precisely aligned with respect to the handler 10. Even the slightest misalignment between the handler 10 and test head 20 can result in poor, or even no, electrical contact between the test contacts 30 and the leads of a plurality of semiconductor devices positioned in the test station 12 for testing. Also, the size and weight of the test head 20 are typically very large, often necessitating the use of mechanical lifting equipment for maneuvering the test head 20 during docking. Because of the significant weight of the test head 20, any misalignment between the test head 20 and handler 10 during a docking operation can result in damage to both the handler 10 and test head 20, and particularly to the test contacts 30. Damaged test contacts 30 will, most likely, provide unreliable electrical contact with mating semiconductor device leads.

From the foregoing discussion, one of ordinary skill in the art will understand the importance of maintaining precise alignment between the test head 20 and handler 10 while docking the test head 20 onto the handler 10. One method for maintaining alignment of the test head 20 relative to the handler 10 is the use of alignment pins 15, as shown in FIG. 1. The alignment pins 15, which are shown attached to the handler 10, mate with corresponding mating holes 25 in the test head 20. Although shown affixed to the handler 10, the alignment pins 15 may be attached to the test head 20 and, accordingly, the mating holes 25 disposed in the handler 10. Typically, as shown in FIG. 1, two alignment pins 15 are used to provide the necessary alignment between the test head 20 and handler 10; however, only one alignment pin 15 or more than two alignment pins 15 may be employed. Also, to provide precise alignment between the test head 20 and handler 10, the design tolerances—size, orientation, and position—of the alignment pins 15 and mating holes 25 are generally relatively small in comparison to the overall dimensions of the test head 20 and handler 10.

The use of alignment pins 15, however, may itself cause problems during semiconductor device testing resulting from binding between the alignment pins 15 and mating holes 25. Generally, binding may be thought of as the braking, or even seizure, of one body relative to another body due to high contact pressure existing between the two bodies. Binding of the alignment pins 15 and mating holes 25 may result in unreliable electrical contact between the test contacts 30 and the leads of a semiconductor device, damage to the test contacts 30, damage to other portions of the test head 20 and handler 10, and damage to the semiconductor devices positioned at the test station 12 for testing. Also, binding between the alignment pins 15 and mating holes 25 can make undocking of the test head 20 difficult, as the binding may essentially "lock" the test head 20 to the handler 10. Further, binding of the alignment pins 15 within the mating holes 25 can damage the alignment pins 15 themselves, which may exacerbate the effects of binding.

Although the present invention is particularly concerned with the problem of alignment and binding between a semiconductor device handler and test head, as described above, the present invention is applicable to the use of alignment pins to align any types of structures. Thus, the following discussion pertaining to the conditions that may cause binding are generally applicable to the alignment of any two bodies using alignment pins or other alignment structures.

For mating structures, such as an alignment pin and mating hole, binding is generally due to interference between surfaces of the mating structures and can result from any one of a number of interference conditions, or binding modes that may exist between the surfaces. Binding modes may be generally classified into four types: (1) those due to design or manufacturing tolerances, (2) those due to positioning errors during joining, (3) those due to thermal effects, and (4) those due to wear and damage. The foregoing binding modes, however, are not all-inclusive and those of ordinary skill in the art will understand that binding may result from conditions other than those described herein.

Binding may result from the unwise selection of design tolerances or from the failure to adhere to design tolerances during manufacture. In either case, interference may result between a surface of an alignment pin and a surface of a mating hole. Such interference may, for example, result from an oversized pin, an undersized hole, or, as shown in FIG. 2, a circular alignment pin 65 extending from a first body 60 mating with a nonconcentric hole 75 in a second body 70. Errors in feature location tolerances may also lead to binding. Referring to FIG. 3, a first body 60 includes a plurality of alignment pins 65 extending transversely therefrom. A second body 70 includes a plurality of holes 75 configured for mating with the alignment pins 65 to align the first and second bodies 60, 70. However, due to tolerancing or manufacturing errors, an alignment pin 65' and hole 75' are out of alignment. For example, the centers of the pin 65' and hole 75' may be linearly offset by a distance 81 or angularly offset through an angle 91.

Binding resulting from errors in design and manufacturing tolerances may also result from a failure to properly orient an alignment pin or mating hole, or both. Referring to FIG. 4, a first body 60 includes a plurality of alignment pins 65 extending from a surface thereof. A second body 70 includes a plurality of holes 75 configured for mating with the alignment pins 65 of the first body 60. One of the alignment pins 65 is incorrectly orientated through an angle 92 relative to its corresponding hole 75 in the second body 70. Similarly, one of the holes 75 is incorrectly orientated through an angle 93 relative to an alignment pin 65 extending from the first body 60. For clarity, the errors in orientation depicted in FIG. 4 are shown only in one plane; however, one of ordinary skill in the art will understand that such errors may occur in multiple planes.

Positioning errors present during joining of two bodies may also result in binding. For example, as shown in FIGS. 5 through 7, two bodies may be improperly aligned during joining. Referring to FIGS. 5 and 6, a first body 60 includes a plurality of alignment pins 65 extending therefrom configured for insertion into corresponding holes 75 in a second body 70. However, the two bodies 60, 70 may be linearly offset by a distance 82 (see FIG. 5) or angularly offset through an angle 94 (see FIG. 6). Similarly, two bodies may be improperly orientated during joining. Referring to FIG. 7, a second body 70 is being joined to a first body 60, and the second body 70 includes a plurality of holes 75 configured for receiving a corresponding plurality of alignment pins 65 extending from the first body 60. The second body 70 is, however, improperly orientated through an angle 95 relative to the first body 60. Although FIG. 7 depicts an orientation error in only one plane, those of ordinary skill in the art will understand that such errors can occur in multiple planes.

Thermal expansion effects may also cause binding between an alignment pin and a mating hole. Referring to FIG. 8, a first body 60 includes an alignment pin 65 mating with a corresponding hole 75 in a second body 70. The alignment pin 65 has a diameter 83 at a first, low temperature. If the temperature of the first body 60 and alignment pin 65 increases to a second, relatively higher temperature, the alignment pin 65 may expand to a larger diameter 84 (shown in dashed line). The hole 75 in the second body 70 may not equivalently expand due to differences in relative temperature or differences in materials used to form the two bodies 60, 70. As the alignments pin 65 thermally expands, the diameter of the alignment pin 65 may eventually equal that of the hole 75 resulting in interference between the outer surface of the alignment pin 65 and surface of the hole 75. Further thermal expansion of the alignment pin 65 will cause increasing interference and contact between surfaces of the alignment pin 65 and hole 75, as well as a large pressure build-up therebetween.

Damage, such as galling, to the surface of an alignment pin or a mating hole may also cause binding. Referring to FIGS. 9 and 10, a first body 60 includes an alignment pin 65 configured for mating with a hole 75 in a second body 70 to be joined with the first body 60. As seen in FIG. 9, a portion 68 of the surface of the alignment pin 65 is damaged during joining of the first and second bodies 60, 70 due to, for example, misorientation of the second body 70. Referring to FIG. 10, the orientation of the second body 70 has been corrected and the bodies 60, 70 joined. However, debris 69*a* sheared from the damaged surface portion 68 of the alignment pin 65 may become lodged between the surface of the alignment pin 65 and the surface of the mating hole 75, resulting in increased frictional forces and possibly jamming between the alignment pin 65 and mating hole 75. Also, the damaged surface portion 68 of the alignment pin 65 may include one or more protrusions 69*b* extending therefrom and impinging upon the surface of the hole 75 in the second body 70, thereby increasing the potential for binding therebetween.

The design and manufacturing tolerance errors, positioning errors, thermal expansion effects, and damage effects depicted in FIGS. 2 through 10 have been exaggerated for clarity. These tolerancing errors, positioning errors, thermal effects, and damage effects may, in practice, be relatively small in dimension. However, even though such errors and effects may be relatively minor, interference between the respective surfaces of an alignment pin and mating hole can result. Also, it will be appreciated by those of ordinary skill in the art that the binding modes described herein—tolerancing errors, positioning errors, thermal effects, and damage effects—may, and most likely will, occur substantially simultaneously and in combination with one another.

Interference between the surfaces of an alignment pin and mating hole may cause immense pressure—especially when aligning heavy structures such as, for example, the test head 20 shown in FIG. 1, which can weigh on the order of 800 to 1000 pounds—at the contact interface between these surfaces, resulting in high frictional forces. High pressure at the contact interface between an alignment pin and mating hole may also lead to adhesion or "cold welding" of a portion of the surface of the alignment pin to the surface of the mating hole. Also, interference between the alignment pin and mating hole may result in the shearing of small particles of material, or debris, from the respective surfaces of the alignment pin and mating hole, as discussed in reference to FIGS. 9 and 10, and the debris itself may cause more interference between the alignment pin and mating hole. Further, the alignment and movement of heavy structures, such as semiconductor device test heads, increase the likelihood of positioning errors, and hence interference, during joining due to the necessity of handling such large, heavy structures with mechanical lifting equipment and the corresponding inability to readily manipulate such structures by hand.

Frictional forces exerted by one structure upon another are generally independent of the apparent surface area of contact (i.e., the area as determined by the overall physical dimensions of the portions of two surfaces in contact) between the two structures. Rather, the forces due to friction are proportional to the real area of contact (i.e., the portions of two surfaces in actual contact at the atomic scale) between the two structures, and the real contact area is proportional to the normal load that the two structures impart to each other. Hence, as is widely known, frictional forces are generally proportional to the normal load. The upper theoretical limit on the real contact area is, of course, bounded by the apparent surface area of contact (although, at its upper limit, the real contact area may exceed the apparent contact area due to surface roughness).

When a very high normal load—and, therefore, high contact pressure—exists between two structures, the real contact area may approach its upper theoretical limit. Thus, for high contact pressure at the interface between two structures, the overall physical dimensions of the apparent surface area of contact may have an effect upon the magnitude of the frictional forces, and it may be desirable to minimize the physical dimensions of the apparent contact surface area. However, for high contact pressure between the surfaces of two structures, the forces required to overcome adhesion or "cold welding" effects—those forces being generally proportional to the adhered surface area—may predominate over those due to friction. Further information relating to the effects of high contact pressure on frictional forces and to the distinction between real and apparent contact surface area can be found in: Machinery's Handbook, 23 Ed., at pgs. 2201–2204 (Industrial Press 1989); Friction: An Introduction to Tribology, F. P. Bowden & D. Tabor, at pgs. 47–75 (Anchor Press 1973); and CRC Handbook of Lubrication (Theory and Practice of Tribology), Vol. II, Theory and Design, at pgs. 31–48 (CRC Press 1983).

Alignment pins known in the art include constant diameter pins and tapered pins having a nonconstant diameter. Another prior art alignment pin known to the inventor, for use with a semiconductor device handler and test head as described with reference to FIG. 1, is shown in FIG. 11. The alignment pin 100 is affixed to a handler 10 and is configured to receive thereon a mating hole 25 in a test head 20 (shown in dashed line) to be docked on the handler 10. The alignment pin 100 includes a straight shank portion 110, an enlarged register portion 120, and an upper tapered portion 130. The shank portion 110 has an outer cylindrical surface 112 of a diameter 114. The shank portion 110 also includes a lower end 116 attached to the handler 10 and an upper end 118 terminating adjacent the register portion 120. The register portion 120 includes an outer surface 122 having a diameter 124 of a dimension nearly equal to, but slightly less than, a diameter of the surface 26 of the mating hole 25 in the test head 20. The register portion 120 is essentially a sphere in which, at the lower end 126 joining with the upper end 118 of the shank portion 110, the lower portion of the sphere has been truncated and, at the upper end 128 joining with a lower end 136 of the tapered portion 130, the upper portion of the sphere is similarly truncated. The tapered portion 130 has a nonconstant diameter that varies from a maximum at the lower end 136 to a minimum at an upper end 138 of the tapered portion 130, resulting in a cylindrical outer surface 132 that is tapered.

The diameter 124 of the register portion 120 is larger than the diameter 114 of the shank portion 110. As a result, an annular clearance zone 140 (shown in dashed line) exists under the outer surface 122 of the register portion 120 and adjacent the outer cylindrical surface 112 of the shank portion 110. Providing a clearance zone 140 compensates for some positional error during joining of the test head 20 to the handler 10. By way of example, as shown in FIG. 11, for a test head 20' (shown in dashed line) and hole 25' with inner surface 26' that have an orientation angularly offset from the orientation of the handler 10 and alignment pin 100, the clearance zone 140 can receive a portion 28 of the test head 20' without interference therebetween, thereby "absorbing" the positional error of the test head 20' until the orientation of the test head 20' can be corrected. When the alignment pin 100 and mating hole 25 are fully engaged, the outer surface 122 of the register portion 120 interfaces with the surface 26 of the mating hole 25 to align the mating hole 25 relative to the alignment pin 100 and, thus, to align the test head 20 and handler 10.

Use of a plurality of prior art alignment pins 100 to align a test head 20 and handler 10 was found to insufficiently alleviate binding between the alignment pins 100 and a plurality of mating holes 25 in the test head 20. Although the prior art alignment pin 100 may compensate for some positional error—specifically, error in angular orientation—during joining of a test head 20 to a handler 10, other binding modes are still present and may predominate. Errors in design and manufacturing tolerances, translational errors during joining, thermal effects, and damage on the surfaces of the alignment pins and mating holes may, either individually or in combination, cause interference between the alignment pins and mating holes and, therefore, the generation of high contact pressure.

It is believed that, due to the weight of the test head, interference between respective surfaces of the alignment pins and mating holes causes high pressure regions of contact between the alignment pins and mating holes. These high pressure contact regions between the respective surfaces of the alignment pins and mating holes may result in the development of high frictional forces therebetween. High pressure contact between the alignment pins and mating holes may also be causing adhesion, or "cold welding," of portions of the surface of an alignment pin to portions of the surface of a mating hole. Also, interference between the alignment pins and mating holes may generate debris that becomes lodged between the alignment pins and mating holes.

Accordingly, a need exists in the art for an alignment pin for use in aligning a first body relative to a second body such that, upon joining of the two bodies, binding between a plurality of the alignment pins extending from the first body and a plurality of mating holes in the second body is significantly reduced or eliminated. Further, there is a need in the art for such an alignment pin for use in docking a test head to a semiconductor device handler.

BRIEF SUMMARY OF THE INVENTION

Embodiments of the present invention include a number of embodiments of an alignment pin for use in aligning any two structures that are to be joined or mated, such as a test head and a semiconductor device handler. An alignment pin according to the present invention includes at least one register portion configured for insertion into a mating hole and alignment of the mating hole thereon. The alignment pin further includes a shank portion joined with the register portion and may also include a tapered portion disposed therebetween. An annular region located adjacent an outer surface of the shank portion and above or below an outer surface of the register portion provides a clearance zone, which can compensate for some positional error during the aligning and joining of two structures.

The outer surface of the register portion may comprise a plurality of contact regions circumferentially separated by relief regions. Any suitable number of contact regions may be incorporated at the outer surface of the register portion. The contact regions need not be equidistantly spaced about the outer surface of the register portion and, further, the contact regions may be disposed on the ends of a plurality of fins extending from the register portion and separated on either side by the relief regions. The plurality of alternating contact and relief regions on the outer surface of the register portion minimizes the amount of surface area of the alignment pin actually in contact with the surface of a mating hole. For high pressure contact at the interface between the alignment pin and the surface of a mating hole, reducing the overall physical dimensions of the surface area in contact may result in lower frictional forces and less adhesion. Also, the relief regions on the outer surface of the register portion act as “junk slots,” providing channels or passages between the register portion and the bore wall of a mating hole for efficiently removing debris from the interface between the alignment pin and the mating hole. Reduced frictional forces at the contact interface between one or more alignment pins and a corresponding number of mating holes, in conjunction with the efficient removal of debris, will reduce the severity of binding that may potentially occur between the alignment pins and mating holes.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

A number of embodiments of an alignment pin according to the present invention are shown and described in FIGS. 12 through 21. The embodiments of an alignment pin disclosed herein may be used to align a test head to a semiconductor device handler during a docking procedure. However, the present invention is not so limited, and those of ordinary skill in the art will appreciate that the alignment pin embodiments of the present invention may be used to align any two structures that are to be joined or mated. Accordingly, the embodiments of the invention set forth below are shown and described with reference to the joining or mating of any two bodies, generally.

Figure 13:
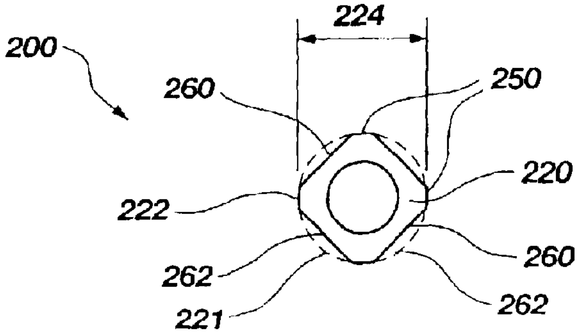
FIG. 13 is a top view of the alignment pin shown in FIG. 12.
Figure 12:
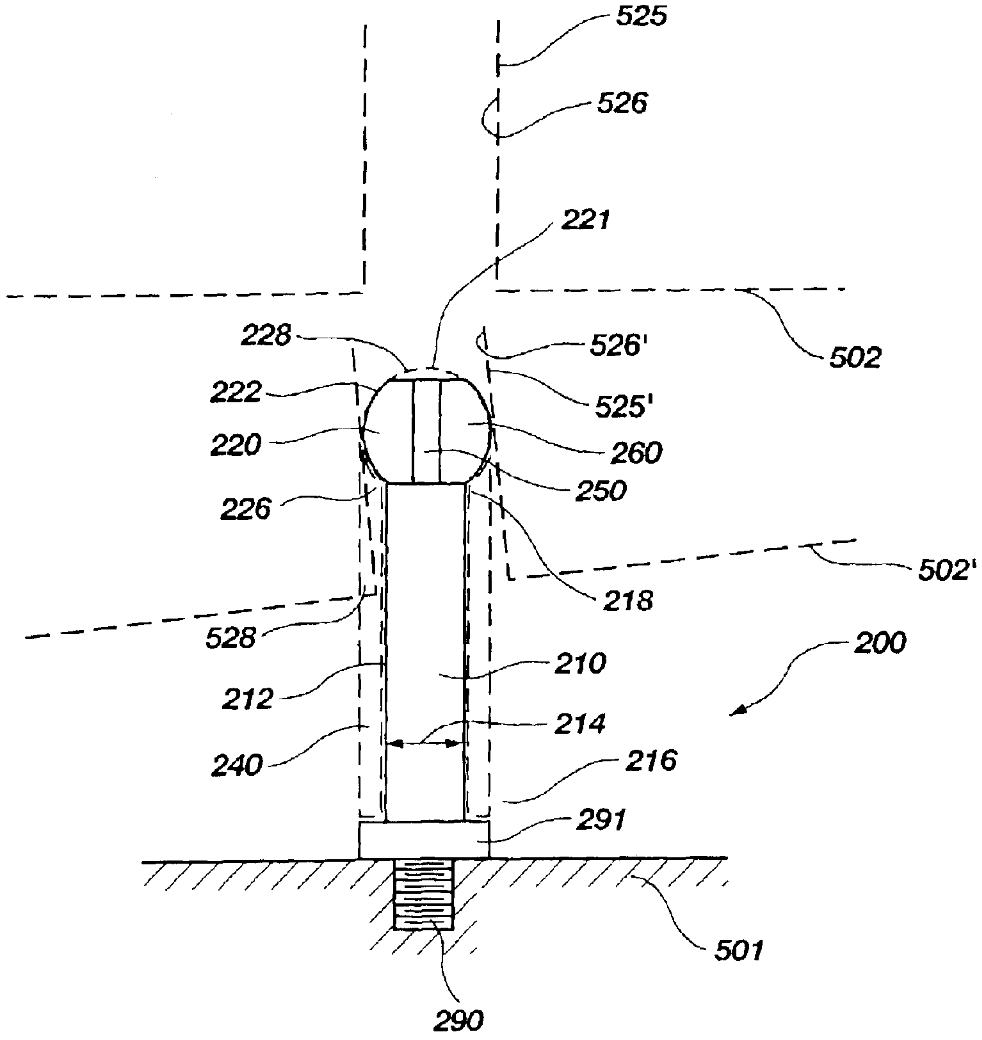
FIG. 12 is an elevation view of an alignment pin according to one embodiment of the present invention.

FIGS. 12 and 13 show one embodiment of an alignment pin 200 according to the present invention. The alignment pin 200 is affixed to a first body 501 that is to be joined with a second body 502 (shown in dashed line), the second body 502 including a mating hole 525 configured to receive the alignment pin 200. The alignment pin 200 engages the mating hole 525 in the second body 502 to align the first and second bodies 501, 502 during joining.

The alignment pin 200 includes a straight shank portion 210 and a register portion 220. The shank portion 210 has an outer cylindrical surface 212 of a diameter 214. At the lower end 216 of the shank portion 210 is an externally threaded section 290 for attachment of the alignment pin 200 to the first body 501. Any other suitable method may be employed to attach the alignment pin 200 to the first body 501 such as, by way of example, a press or interference fit, welding, or adhesive bonding. A mounting flange 291 may also be disposed proximate the lower end 216 of the alignment pin 200 to assist in mounting the alignment pin 200 to the first body 501. The upper end 218 of the shank portion 210 joins with the lower end 226 of the register portion 220.

The register portion 220 includes an outer surface 222 comprised of contact regions 250 circumferentially separated by relief regions 260. The register portion 220 essentially comprises a sphere having its lower end 226 and upper end 228 truncated and further having portions removed to form the relief regions 260. Thus, all surfaces of the register portion 220 rest within, or lie on the boundary of, a spherical envelope 221. The contact regions 250 extend to the boundary of the spherical envelope 221, while the relief regions 260 are of a lesser lateral extent than the contact regions 250 and, therefore, do not extend to the boundary of the spherical envelope 221.

The contact regions 250 of outer surface 222 have a diameter 224 that is larger than the diameter 214 of the shank portion 210, providing an annular clearance zone 240 (shown in dashed line) under the outer surface 222 of the register portion 220 and adjacent the outer cylindrical surface 212 of the shank portion 210. The clearance zone 240 compensates for some positional error during joining of the second body 502 to the first body 501. As shown in FIG. 12, for a second body 502' (shown in dashed line) and hole 525' with inner surface 526' that have an orientation angularly offset from the orientation of the first body 501 and alignment pin 200, the clearance zone 240 can receive a portion 528 of the second body 502' without interference therebetween to compensate for the orientation error until such error is corrected.

When the mating hole 525 of the second body 502 and the alignment pin 200 extending from the first body 501 are fully engaged, the contact regions 250 on the outer surface 222 of the register portion 220 interface with the wall or surface 526 of the mating hole 525 to align the mating hole 525 relative to the alignment pin 200 and, therefore, to align the second body 502 relative to the first body 501. The relief regions 260 on the outer surface 222 of the register portion 220 do not contact the surface 526 of the mating hole 525. The plurality of alternating contact and relief regions 250, 260 on the outer surface 222 of the register portion 220 minimizes the overall physical dimensions of the surface area (i.e., the apparent contact surface area) of the alignment pin 200 contacting the surface 526 of the mating hole 525.

As noted above with respect to the prior art alignment pin 100, when two structures are joined using alignment pins to align the two structures during joining, high pressure regions of contact may develop between the respective surfaces of the alignment pins and the mating holes. The high pressure contact regions may lead to high frictional forces between the alignment pin and the mating hole. High contact pressure between an alignment pin and a mating hole may also lead to adhesion of a portion of the surface of the alignment pin to a portion of the surface of the mating hole. The force necessary to overcome, or break, the adhesion bond between the alignment pin and mating hole would be proportional to the quantity of surface area that is adhered. The relief regions 260 on the outer surface 222 of the register portion 220 of the alignment pin 200 minimize the surface area of the alignment pin 200 that can potentially become adhered to the surface of the mating hole 525.

The relief regions 260 on the outer surface 222 of the register portion 220 also provide longitudinal "junk slots" 262 to facilitate movement of debris between register portion 220 and the wall 526 of mating hole 525. During engagement of the alignment pin 200 with a mating hole 525, it is likely that errors in positioning or tolerances will be present, leading to interference between the alignment pin 200 and mating hole 525. This interference can cause damage to the respective surfaces of the alignment pin 200 and mating hole 525 and result in generation of debris. However, rather than becoming lodged between the alignment pin 200 and mating hole 525, and thereby causing increased frictional forces or jamming, particles of debris can escape through the junk slots 262, each junk slot 262 being bounded by a respective relief region 260 on the outer surface 222 of the register portion 220 of the alignment pin 200 and by a portion of the wall 526 of mating hole 525 when alignment pin 200 engages mating hole 525.

Thus, the provision of relief regions 260 on the outer surface 222 of the register portion 220 of an alignment pin 200, as taught by the present invention, significantly reduces the overall physical dimensions of the surface area on the alignment pin 200 that can potentially contact, and consequently become adhered to, the surface 526 of a mating hole 525. The relief regions 260 also function as junk slots 262 that allow for the passage therethrough of debris between alignment pin 200 and the wall 526 of mating hole 525. As a result, the magnitude of the frictional and/or adhesion forces—and, hence, the severity of binding—that occur at the interface between the alignment pin 200 and mating hole 525 is greatly reduced, even for high contact pressures.

Figure 14:
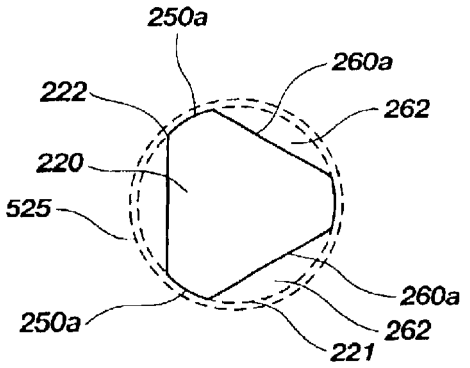
FIG. 14 is a top view of an alternative embodiment of the alignment pin shown in FIGS. 12 and 13.

Junk slots 262 and relief regions 260 on the outer surface 222 of the register portion 220 of an alignment pin 200 may, according to the present invention, be provided by a number of geometric configurations. For example, referring to FIG. 14, any suitable number of contact regions 250*a* circumferentially separated by relief regions 260*a* may be provided on the outer surface 222 of the register portion 220. Although three contact regions 250*a* separated by three relief regions 260*a* are shown in FIG. 14, and four alternating contact and relief regions 250, 260, respectively, are shown in FIGS. 12 and 13, any other suitable number of contact and relief regions may be employed.

Figure 15:
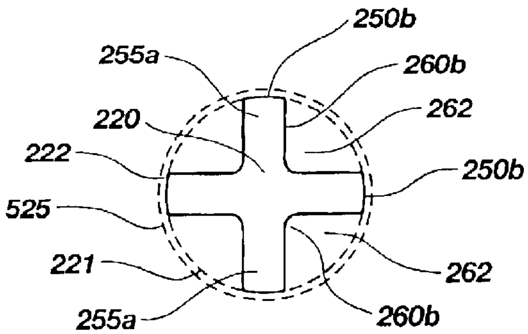
FIG. 15 is a top view of an alternative embodiment of the alignment pin shown in FIGS. 12 and 13.
Figure 16:
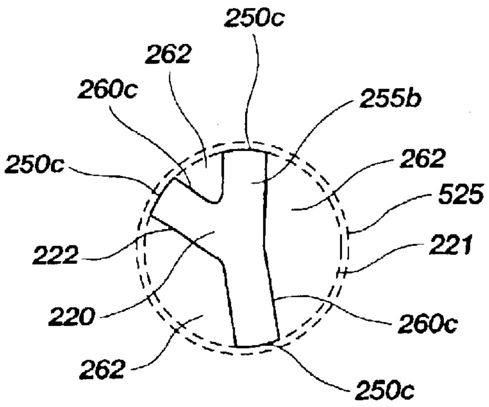
FIG. 16 is a top view of an alternative embodiment of the alignment pin shown in FIGS. 12 and 13.
Figure 17:
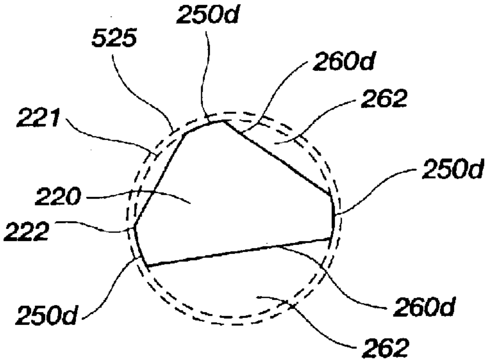
FIG. 17 is a top view of an alternative embodiment of the alignment pin shown in FIGS. 12 and 13.

Alternatively, as shown in FIG. 15, the contact regions 250*b* on the outer surface 222 of the register portion 220 may be provided on a plurality of fins 255*a* separated by relief regions 260*b* and defining a cross-shaped transverse cross section for register portion 220. Also, as shown in FIGS. 16 and 17, the circumferential spacing between the contact regions on the outer surface 222 of the register portion 220 do not necessarily have to be equidistantly spaced. For example, the register portion 220 shown in FIG. 16 includes three fins 255*b* defining a "Y"-shaped transverse cross section and having contact regions 250*c* separated by relief regions 260*c* that are not equidistantly spaced. Similarly, the register portion 220 shown in FIG. 17 includes three nonequidistantly spaced contact regions 250*d* separated by relief regions 260*d*. The contact regions 250*d* and relief regions 260*d* shown in FIG. 17 (as well as those shown in FIGS. 13 and 14) define a polygonal transverse cross section for register portion 220.

Figure 18:
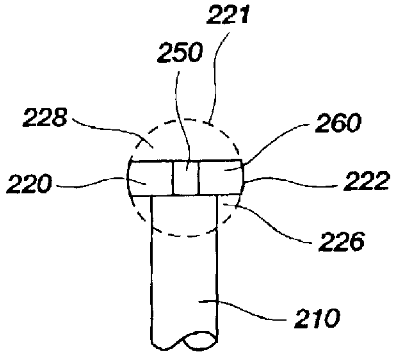
FIG. 18 is a top view of an alternative embodiment of the alignment pin shown in FIGS. 12 and 13.

In a further embodiment of the alignment pin 200, as shown in FIG. 18, the lower and upper ends 226, 228 of the register portion 220 are further truncated to provide a thin, disk-shaped register portion 220. Again, all surfaces of the thin, disk-shaped register portion 220 lie within, or on the boundary of, the spherical envelope 221. Employing a thin, disk-shaped register portion 220 further minimizes the overall physical dimensions of the surface area of the contact regions 250 that can interface with, and possibly adhere to, the surface of a mating hole. Those of ordinary skill in the art will appreciate that any of the embodiments of the alignment pin 200 shown in FIGS. 12 through 18 may be implemented in combination. By way of example only, the thin, disk-shaped register portion 220 shown in FIG. 18 may include equidistantly spaced fins 255*a* or nonequidistantly spaced fins 255*b*, as shown in FIGS. 15 and 16, respectively, or may define an octagon, hexagon, or other polygonal transverse cross section.

Figure 20:
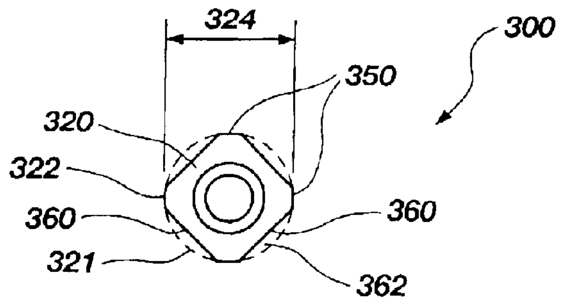
FIG. 20 is a top view of the alignment pin shown in FIG. 19.
Figure 19:
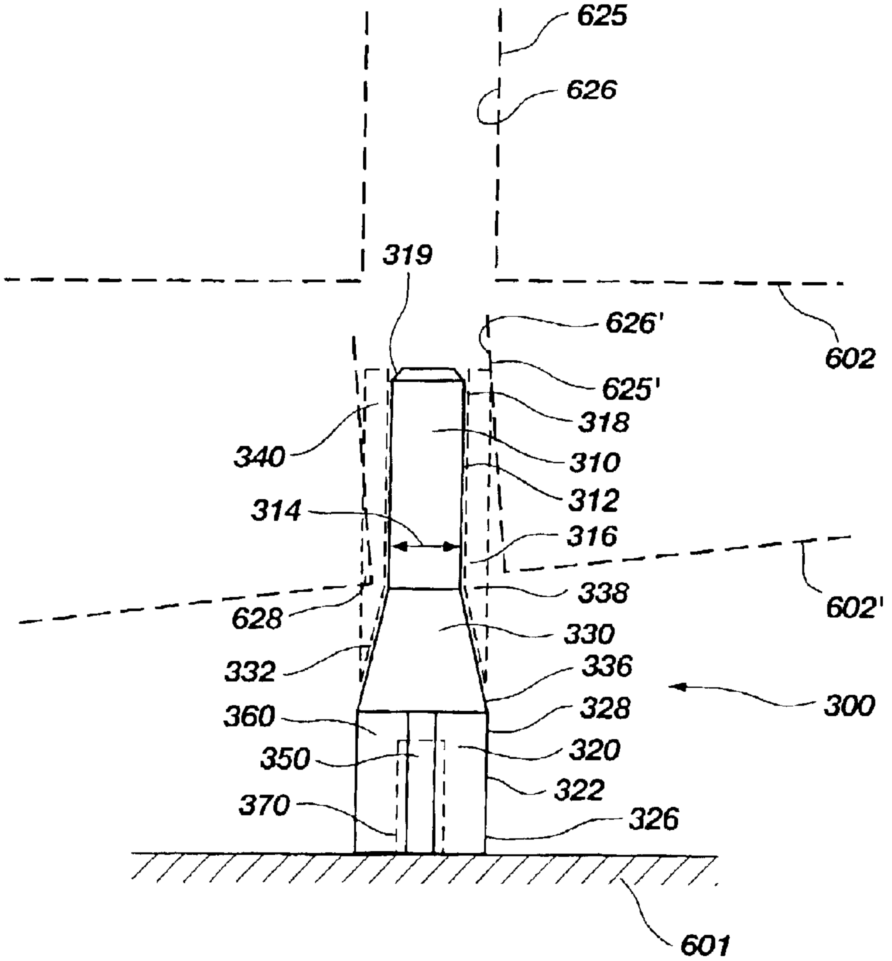
FIG. 19 is an elevation view of an alignment pin according to another embodiment of the present invention.

Shown in FIGS. 19 and 20 is another embodiment of an alignment pin 300 according to the present invention. The alignment pin 300 is attached to a first body 601 that is to be joined to a second body 602 (shown in dashed line). A mating hole 625 on the second body 602 is configured to receive the alignment pin 300 therein. The alignment pin 300 engages the mating hole 625 in the second body 602 to align the first and second bodies 601, 602 during joining.

The alignment pin 300 includes a straight shank portion 310, a tapered portion 330, and a register portion 320. The shank portion 310 includes an outer cylindrical surface 312 of a diameter 314. The upper end 318 of the shank portion 310 forms the tip of the alignment pin 300, which may include a chamfer 319. The lower end 316 of the shank portion 310 joins with the upper end 338 of the tapered portion 330. The tapered portion 330 has an outer cylindrical surface 332 of nonconstant diameter. The diameter of the tapered portion 330 is a minimum diameter where the upper end 338 joins to the lower end 316 of the shank portion 310 that tapers to a maximum diameter where the lower end 336 of the tapered portion 330 joins to the upper end 328 of the register portion 320. The tapered portion 330 guides the mating hole 625 in the second body 602 onto the register portion 320 to compensate for some positional error during joining of the second body 602 to the first body 601.

The lower end 326 of the register portion 320 may include a threaded hole 370 for attaching the alignment pin 300 to the first body 601. Any other suitable method may be employed to attach the alignment pin 300 to the first body 601 such as, for example, a press or interference fit, welding, or adhesive bonding. The lower end 326 of the register portion 320 may also include a mounting flange (see FIG. 12) to aide in attachment of the alignment pin 300 to the first body 601.

The register portion 320 includes an outer surface 322 comprised of contact regions 350 circumferentially separated by relief regions 360. The register portion 320 essentially comprises a cylinder having portions removed to form the relief regions 360. Thus, all surfaces of the register portion 320 rest within, or lie on the boundary of, a cylindrical envelope 321. The contact regions 350 extend to the boundary of the cylindrical envelope 321, while the relief regions 360 are of a lesser lateral extent than the contact regions 350 and, therefore, do not extend to the boundary of the cylindrical envelope 321.

The contact regions 350 on outer surface 322 of register portion 320 have a diameter 324 that is larger than the diameter 314 of the shank portion 310, providing an annular clearance zone 340 (shown in dashed line) above the outer surface 322 of the register portion 320 and adjacent the outer cylindrical surfaces 332, 312 of the tapered and shank portions 330, 310, respectively. The clearance zone 340 compensates for some positional error during joining of the second body 602 to the first body 601. Referring to FIG. 19, for a second body 602' (shown in dashed line) and hole 625' with inner surface 626' that have an orientation angularly offset from the orientation of the first body 601 and alignment pin 300, the clearance region 340 can receive a portion 628 of the second body 602' without interference therebetween to compensate for the orientation error until such error is corrected.

When the mating hole 625 of the second body 602 and the alignment pin 300 extending from the first body 601 are fully engaged, the contact regions 350 on the outer surface 322 of the register portion 320 interface with the wall or surface 626 of the mating hole 625 to align the mating hole 625 relative to the alignment pin 300 and, hence, to align the second body 602 with respect to the first body 601. The relief regions 360 on the outer surface 322 of the register portion 320 do not contact the surface 626 of the mating hole 625. Similar to the alignment pin 200 shown in FIGS. 12 and 13, the plurality of alternating contact and relief regions 350, 360 on the outer surface 322 of the register portion 320 minimizes the overall physical dimensions of the surface area of the alignment pin 300 in contact with the surface 626 of the mating hole 625 and, as a result, the amount of adhesion and the magnitude of the frictional forces generated at the interface between the alignment pin 300 and the mating hole 625 are reduced. The relief regions 360 on the outer surface 322 of the register portion 320 also provide junk slots 362 for removal of debris. Once again, reducing the frictional forces existing between the alignment pin 300 and mating hole 625 is believed to directly reduce the severity of binding between the alignment pin 300 and mating hole 625.

The junk slots 362 and relief regions 360 on the outer surface 322 of the register portion 320 of the alignment pin 300 may be provided by a number of geometric configurations. The various configurations of the register portion 220 of the alignment pin 200, as described above, may also be incorporated into the outer surface 322 of the register portion 320 of the alignment pin 300. For example, the register portion 320 may include any suitable number of contact and relief regions 350, 360 (see FIG. 14). The contact regions 350 on the outer surface 322 of the register portion 320 may be provided on a plurality of fins circumferentially separated by relief regions 360 (see FIGS. 15 and 16). Also, the circumferential spacing between the contact regions 350 on the outer surface 322 of the register portion 320 need not be equidistantly spaced (see FIGS. 16 and 17).

Figure 21:
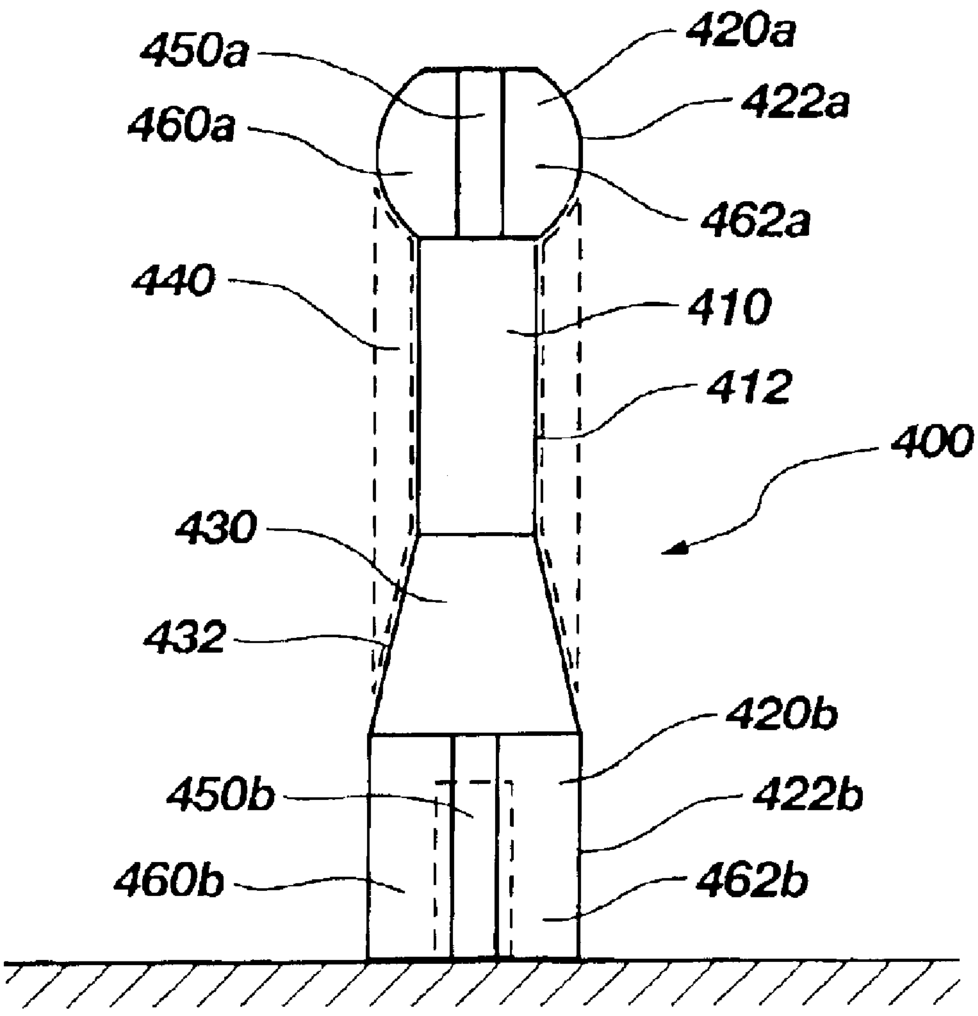
FIG. 21 is an elevation view of an alignment pin according to a further embodiment of the present invention.

It will be appreciated by those of ordinary skill in the art that any combination of the features of the alignment pins 200, 300 herein described may be incorporated into an alignment pin. Shown in FIG. 21 is a further embodiment of the present invention incorporating elements of the alignment pins 200, 300. Referring to FIG. 21, the alignment pin 400 includes a straight shank portion 410 disposed between an upper register portion 420*a* and a lower register portion 420*b*. A tapered portion 430 lies intermediate of the shank portion 410 and lower register portion 420*b*. An annular clearance zone 440 (shown in dashed line) is provided in the region above the outer surface 422*b* of the lower register portion 420*b*, adjacent the outer surfaces 432, 412 of the tapered and shank portions 430, 410, respectively, and below the outer surface 422*a* of the upper register portion 420*a*.

The upper register portion 420*a* includes a plurality of contact regions 450*a* separated by relief regions 460*a* on its outer surface 422*a*. Similarly, the outer surface 422*b* of the lower register portion 420*b* includes a plurality of contact regions 450*b* separated by relief regions 460*b*. The relief regions 460*a*, 460*b* on the upper and lower register portions 420*a*, 420*b*, respectively, provide junk slots 462*a*, 462*b*. The contact regions 450*a*, 450*b* on the upper and lower register portions 420*a*, 420*b* may be provided by any suitable geometric configuration as described herein in relation to the other embodiments of an alignment pin 200, 300 according to the present invention. For example, either of the upper and lower register portions 420*a*, 420*b* may include a plurality of fins (see FIGS. 15 and 16). Alternatively, the upper register portion 420*a* may be a thin, disk-shaped structure (see FIG. 18). Similar to the alignment pins 200, 300, the alignment pin 400 minimizes the overall physical dimensions of the surface area of contact (i.e., the apparent area of contact) between the alignment pin 400 and the wall of a mating hole, thereby decreasing adhesion and frictional forces resulting from high contact pressures and, therefore, the likelihood of binding.

The upper register portion 420*a* of the alignment pin 400 comprises a substantially spherical shape and the lower register portion 420*b* comprises a substantially cylindrical shape. However, it should be understood by those of ordinary skill in the art that the register portions 420*a*, 420*b* shown in FIG. 20 are only exemplary and, further, that the register portions 420*a*, 420*b* of an alignment pin 400 having multiple register portions may be of any suitable shape. For example, the alignment pin 400 may include an upper register portion 420*a* comprising a substantially spherical shape, as shown in FIG. 21, and a lower register portion 420*b* that also comprises a substantially spherical shape.

The alignment pins 200, 300, 400 may be constructed of any suitable materials, the most desirable materials being a function of the specific application and material properties of the mating hole. A number of steel materials are believed suitable for any of the alignment pins 200, 300, 400 of the present invention, including carbon steel, stainless steel, and other alloy steels. However, nonferrous metals, as well as plastic materials, may be suitable for some applications. Although hardened materials, such as a case-hardened steel, may be used to construct an alignment pin 200, 300, 400 of the present invention, such hardened materials may be unsuitable for some applications as a pin 200, 300, 400 constructed of a relatively hard material (compared to the material of the mating hole and structure) can lead to galling of surfaces that the pin 200, 300, 400 comes into contact with. Generally, any of the alignment pins 200, 300, 400 would be fabricated as a single piece of material; however, it is within the scope of the present invention that the various portions of the alignment pins 200, 300, 400 be separately constructed and thereafter joined together. For example, it may be desirable to construct the register portion and shank portion from different materials and to thereafter join the two portions.

Figure 1:
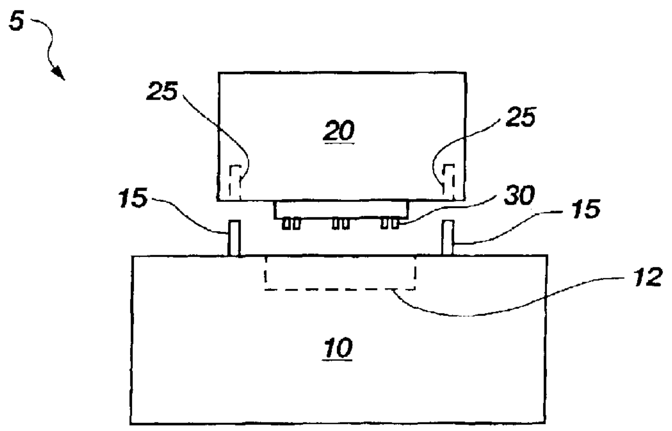
FIG. 1 is a schematic view of a conventional semiconductor device handler and test head.
Figure 2:
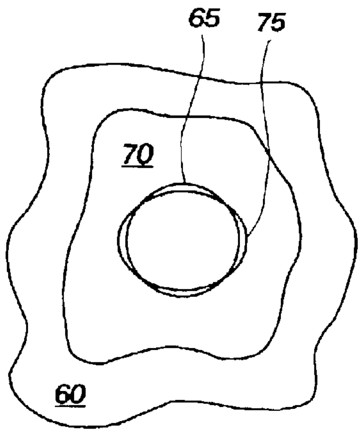
FIG. 2 is a schematic view depicting an alignment pin or mating hole exhibiting a design or manufacturing tolerance error.
Figure 3:
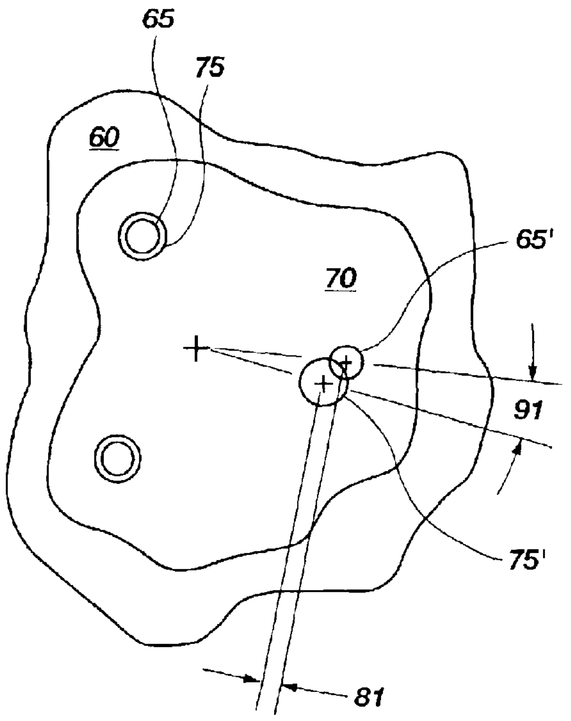
FIG. 3 is a schematic view depicting a plurality of alignment pins mating with a corresponding number of holes and exhibiting a design or manufacturing tolerance error.
Figure 4:
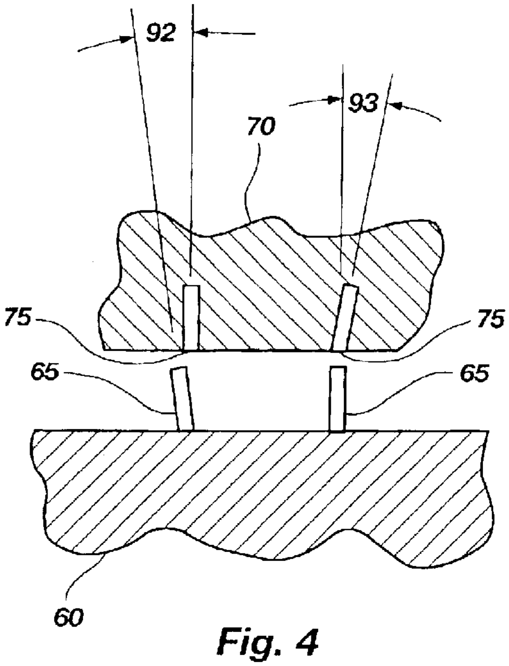
FIG. 4 is a schematic view depicting two alignment pins mating with a corresponding number of holes and exhibiting a design or manufacturing tolerance error.
Figure 5:
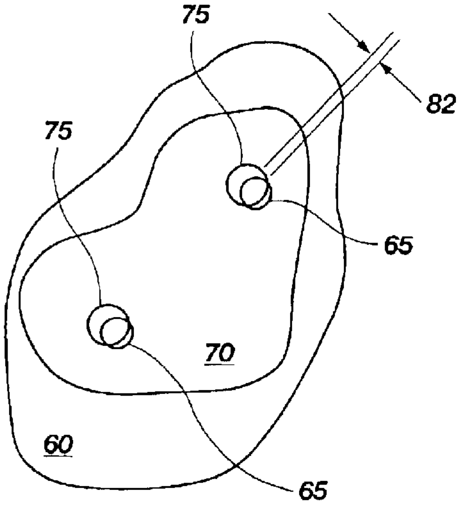
FIG. 5 is a schematic view depicting a positional error existing between two structures to be joined or mated.
Figure 6:
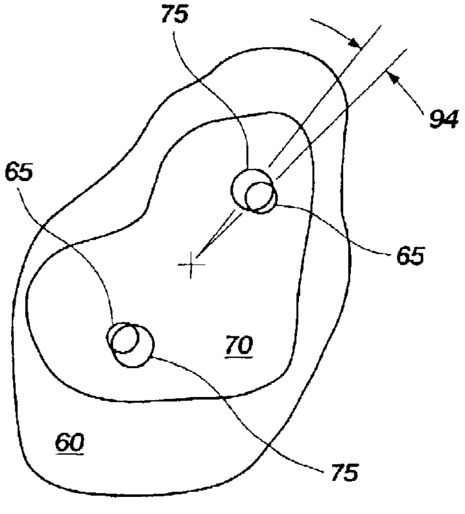
FIG. 6 is a schematic view depicting a positional error existing between two structures to be joined or mated.
Figure 7:
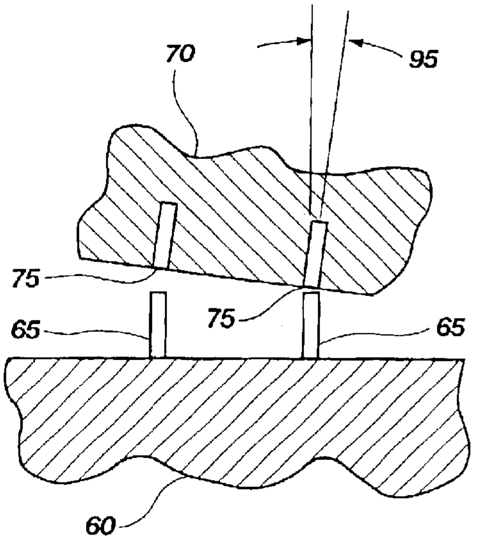
FIG. 7 is a schematic view depicting a positional error existing between two structures to be joined or mated.
Figure 8:
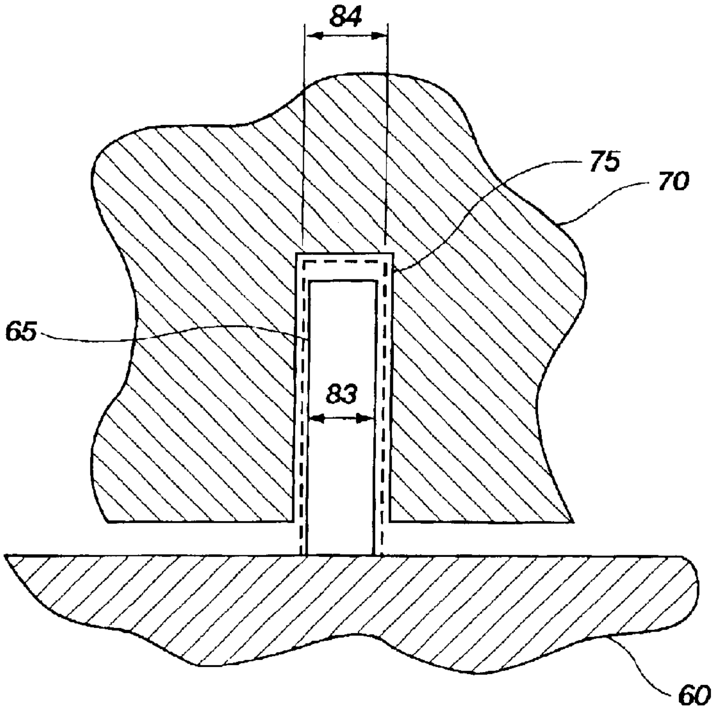
FIG. 8 is a schematic view depicting the effects of thermal expansion on an alignment pin engaged in a mating hole.
Figure 9:
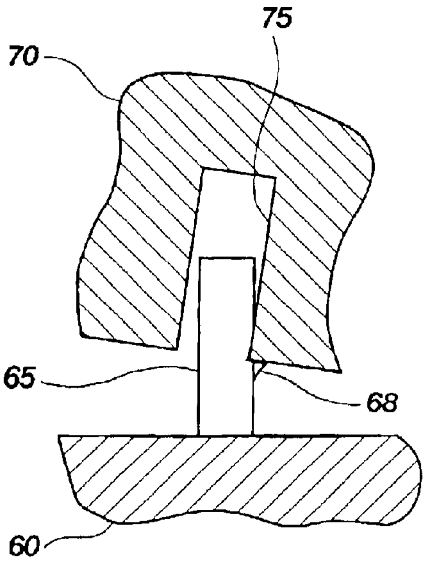
FIG. 9 is a schematic view depicting damage to an alignment hole during engagement with a mating hole.
Figure 10:
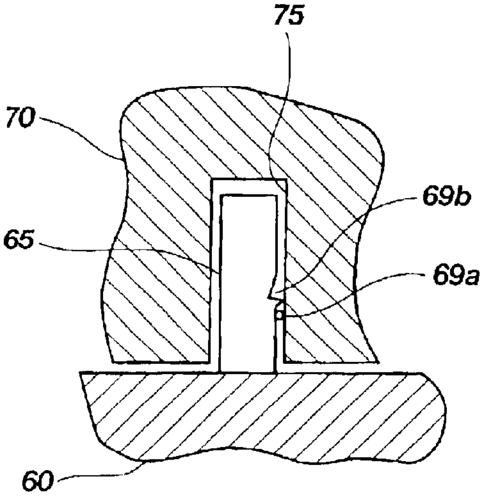
FIG. 10 is a schematic view depicting the effects of damaged surfaces on an alignment pin engaged in a mating hole.
Figure 11:
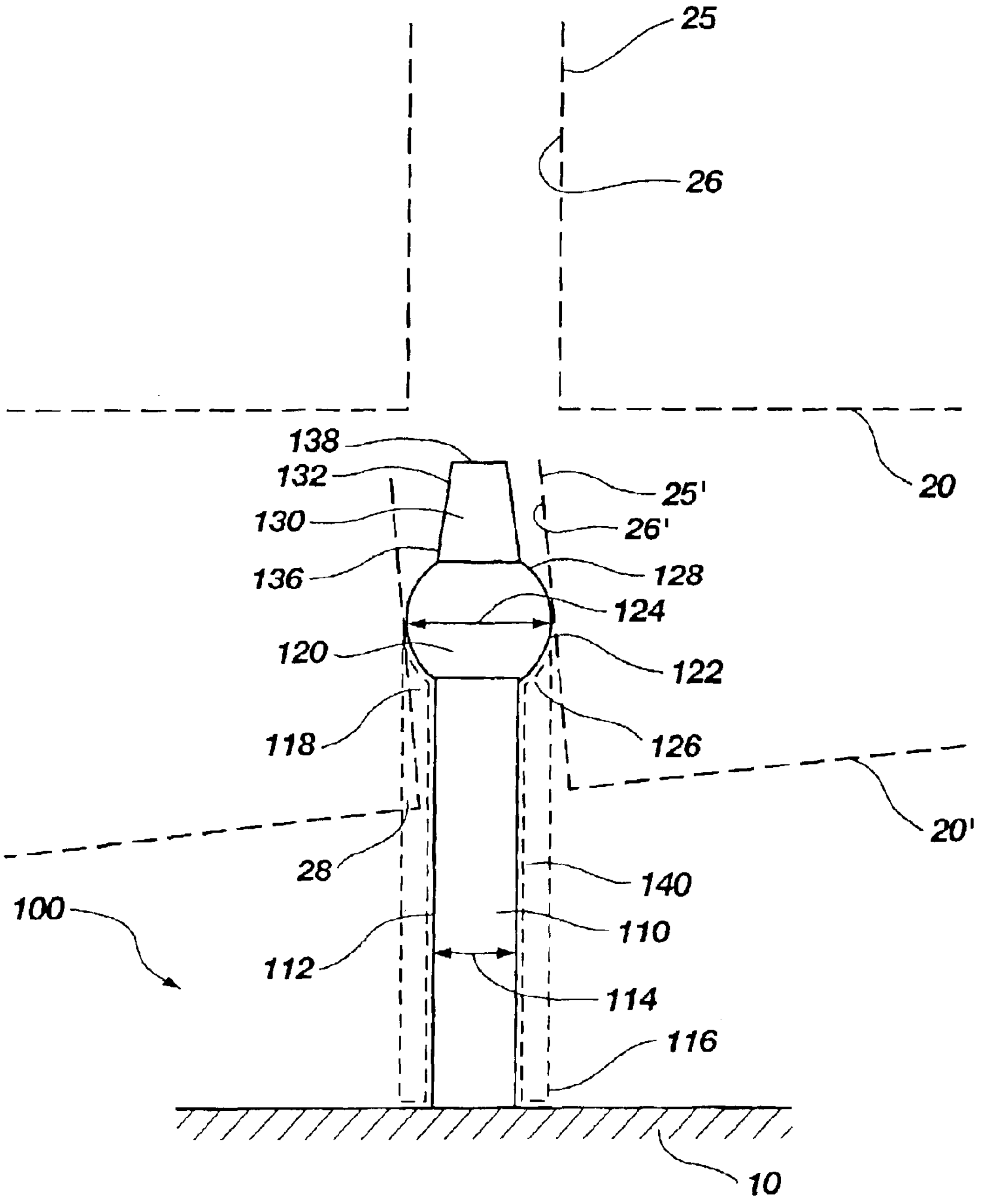
Fig. 11 (PRIOR ART)
FIG. 11 is an elevation view of a prior art alignment pin known to the inventor.

Any suitable number of alignment pins 200, 300, 400 according to the present invention can be incorporated into an alignment system for use in aligning any two structures that are to be joined or mated. By way of example, the alignment pins 200, 300, 400, as shown in FIGS. 12 through 21, can be incorporated into an alignment system for aligning a test head 20 and a semiconductor device handler 10, as shown in FIG. 1, during docking. A method of aligning the test head 20 and handler 10 includes affixing one or more of any one of the alignment pins 200, 300, 400 to one of the test head 20 and handler 10. A corresponding number of mating holes are provided on the other of the test head 20 and handler 10. For example, the handler 10 may include two alignment pins 200, 300, 400 affixed thereto and the test head 20 would include two mating holes 25. A mechanical lifting device, such as a crane (not shown in FIG. 1), positions the test head 20 over the handler 10 and substantially (though not necessarily precisely) aligns the alignment pins 200, 300, 400 with the mating holes 25. The test head 20 is then lowered towards the handler 10 and the alignment pins 200, 300, 400 engage the mating holes 25 and precisely align the test head 20 to the handler 10. A clearance zone 240, 340, 440 on the alignment pins 200, 300, 400 may compensate for some positional error when the mating hole 25 engages the alignment pins 200, 300, 400 until the positional error can be corrected.

As the test head 20 is further lowered toward the handler 10 to achieve full engagement between the alignment pins 200, 300, 400 and the respective walls of mating holes 25, binding may occur as a result of errors in design and manufacturing tolerances, as a result of positioning errors, as a result of thermal expansion, and/or as a result of damage and wear on the surfaces of the alignment pins 200, 300, 400 and the walls of mating holes 25. However, the alternating contact and relief regions 250, 260, 350, 360, 450_a_, 460_a_, 450_b_, 460_b_ on the outer surface 222, 322, 422_a_, 422_b_ of the register portion 220, 320, 420_a_, 420_b_ of the alignment pins 200, 300, 400 limits the overall physical dimensions of the contact surface area between the alignment pins 200, 300, 400 and the walls of mating holes 25 and, for high pressure contact, a reduction in the amount of adhesion and the magnitude of frictional forces at the contact interface between the alignment pins 200, 300, 400 and the walls of mating holes 25. Also, junk slots 262, 362, 462_a_, 462_b_ allow debris to escape from between an alignment pin 200, 300, 400 and the wall of a mating hole 25, thereby preventing the debris from becoming lodged between the alignment pin 200, 300, 400 and mating hole 25. Accordingly, the severity of binding that may occur between the alignment pins 200, 300, 400 and mating holes 25 is reduced.

Exemplary embodiments of an alignment pin according to the present invention having been herein described, those of ordinary skill in the art will appreciate the advantages of the present invention. The alignment pins 200, 300, 400 according to the present invention provide a significant reduction in the overall physical dimensions of the surface area that may contact a surface of a mating hole (i.e., the apparent contact surface area) in comparison to prior art alignment pins known to the inventor. Limiting the overall physical dimensions of the contact surface area between an alignment pin extending from a first body and a mating hole in a second body can be of great importance when high contact pressures are present between the alignment pin and mating hole during the aligning and joining of the two bodies. The regions of high contact pressure can result in adhesion between surfaces of the alignment pin and mating hole, the maximum amount of surface area that can be adhered being limited by the total quantity of contacting surface area. These regions of high contact pressure can also generate very large frictional forces. The forces necessary to overcome adhesion and friction are believed to be a significant component of the force required to separate two structures, such as an alignment pin and a mating hole, that have become bound or "seized." Further, the alignment pins 200, 300, 400 of the present invention reduce the potential for binding by providing junk slots for efficiently removing particles of debris.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the preferred embodiments, as well as alternative arrangements, may be devised by those skilled in the art without departing from the spirit of the present invention and the scope of the appended claims.

What is claimed is:

1. An alignment system for aligning a first body relative to a second body to be joined with the first body, the second body including a plurality of holes, the alignment system comprising:

a first alignment pin attached to the first body including:

a shank portion with a longitudinal axis extending from a first end thereof to a second end thereof and having a first outer dimension transverse to the longitudinal axis; and a register portion disposed on the shank portion and including an outer surface comprising a plurality of contact regions having a second outer dimension greater than the first outer dimension, the plurality of contact regions separated by relief regions of a lesser lateral extent than the plurality of contact regions;

wherein the register portion on the first alignment pin is configured for insertion into one hole of the plurality of holes in the second body, the second outer dimension of the plurality of contact regions on the outer surface of the register portion being slightly less than a diameter of the one hole.

2. The alignment system of claim 1, further comprising:

at least one other alignment pin attached to the first body including:

a shank portion with a longitudinal axis extending from a first end thereof to a second end thereof and having a first outer dimension transverse to the longitudinal axis; and a register portion disposed on the shank portion and including an outer surface comprising a plurality of contact regions having a second outer dimension greater than the first outer dimension, the plurality of contact regions separated by relief regions of a lesser lateral extent than the plurality of contact regions;

wherein the register portion on the at least one other alignment pin is configured for insertion into another hole of the plurality of holes in the second body, the second outer dimension of the plurality of contact regions on the outer surface of the register portion being slightly less than a diameter of the another hole.

3. The alignment system of claim 1, wherein the first alignment pin further includes a second register portion.

4. The alignment system of claim 1, wherein the register portion on the first alignment pin further comprises a plurality of fins, each fin of the plurality of fins terminating at one of the plurality of contact regions and separated from adjacent fins by one of the relief regions.

5. A semiconductor device test system, comprising:

a handler configured for moving a plurality of semiconductor devices to a test station for testing;

a test head configured for docking on the handler, the test head including a plurality of test contacts extending therefrom configured to engage a plurality of leads extending from each semiconductor device of the plurality of semiconductor devices positioned at the test station when the test head is docked on the handler; and at least one alignment pin attached to one of the handler and the test head comprising:

a shank portion with a longitudinal axis extending from a first end thereof to a second end thereof and having a first outer dimension transverse to the longitudinal axis; and a register portion disposed on the shank portion and including an outer surface comprising a plurality of contact regions having a second outer dimension greater than the first outer dimension, the plurality of contact regions separated by relief regions of a lesser lateral extent than the plurality of contact regions;

wherein the register portion is configured for insertion into a hole in the other of the handler and the test head, the second outer dimension of the plurality of contact regions on the outer surface of the register portion being slightly less than a diameter of the hole.

6. The test system of claim 5, further comprising at least one other alignment pin attached to the other of the handler and the test head comprising:

a shank portion with a longitudinal axis extending from a first end thereof to a second end thereof and having a first outer dimension transverse to the longitudinal axis; and a register portion disposed on the shank portion and including an outer surface comprising a plurality of contact regions having a second outer dimension greater than the first outer dimension, the plurality of contact regions separated by relief regions of a lesser lateral extent than the plurality of contact regions;

wherein the register portion is configured for insertion into another hole in the other of the handler and the test head, the second outer dimension of the plurality of contact regions on the outer surface of the register portion being slightly less than a diameter of the another hole.

7. The test system of claim 5, wherein the at least one alignment pin further includes a second register portion.

8. The test system of claim 5, wherein the register portion on the at least one alignment pin further comprises a plurality of fins, each fin of the plurality of fins terminating at one of the plurality of contact regions and separated from adjacent fins by one of the relief regions.

9. A method of aligning a first body relative to a second body while joining the first and second bodies, comprising:

moving the first body towards the second body to engage at least one alignment pin extending from one of the first body and the second body with a mating hole in the other of the first body and the second body; and engaging a wall of the mating hole with a plurality of contact regions on an outer surface of a register portion of the at least one alignment pin to align the first body relative to the second body, the plurality of contact regions separated by relief regions not contacting the wall of the mating hole.

10. The method of claim 9, further comprising compensating for at least some positional error with a clearance zone of the at least one alignment pin while engaging the wall of the mating hole with the register portion of the at least one alignment pin.

11. The method of claim 9, further comprising removing debris from between the at least one alignment pin and the wall of the mating hole through a plurality of junk slots, each junk slot of the plurality of junk slots bounded by one of the relief regions and a portion of the wall of the mating hole.

12. A method of docking a test head onto a semiconductor device handler, comprising:

moving the test head toward the handler to engage at least one alignment pin extending from one of the test head and the handler with a mating hole in the other of the test head and the handler; and engaging a wall of the mating hole with a plurality of contact regions on an outer surface of a register portion of the at least one alignment pin, the plurality of contact regions separated by relief regions not contacting the wall of the mating hole.

13. The method of claim 12, further comprising compensating for at least some positional error with a clearance zone of the at least one alignment pin while engaging the wall of the mating hole with the register portion of the at least one alignment pin.

14. The method of claim 12, further comprising removing debris from between the at least one alignment pin and the wall of the mating hole through a plurality of junk slots, each junk slot of the plurality of junk slots bounded by one of the relief regions and a portion of the wall of the mating hole.

* * * * *